(12) United States Patent
Seo et al.

(10) Patent No.: US 11,705,073 B2
(45) Date of Patent: Jul. 18, 2023

(54) DRD TYPE DISPLAY PANEL AND ORGANIC LIGHT EMITTING DISPLAY DEVICE USING SAME

(71) Applicant: LG Display Co., Ltd., Seoul (KR)

(72) Inventors: Hyung-Seok Seo, Seoul (KR); Young-Hoon Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/122,171

(22) Filed: Dec. 15, 2020

(65) Prior Publication Data

US 2021/0201829 A1 Jul. 1, 2021

(30) Foreign Application Priority Data

Dec. 26, 2019 (KR) .................. 10-2019-0174932

(51) Int. Cl.
*G09G 3/3291* (2016.01)
*G09G 3/3233* (2016.01)
*G09G 3/3225* (2016.01)

(52) U.S. Cl.
CPC ....... *G09G 3/3291* (2013.01); *G09G 2310/08* (2013.01)

(58) Field of Classification Search
None
See application file for complete search history.

(56) References Cited

U.S. PATENT DOCUMENTS

| 6,771,028 B1* | 8/2004 | Winters | G09G 3/3233 315/169.1 |
| 10,204,565 B2 | 2/2019 | Park et al. | |
| 10,269,277 B2* | 4/2019 | Shim | G09G 3/006 |
| 10,269,300 B2* | 4/2019 | Xiang | G09G 3/3266 |
| 10,896,643 B2* | 1/2021 | Li | G09G 3/3241 |
| 2007/0195020 A1* | 8/2007 | Nathan | G09G 3/3233 345/76 |

(Continued)

FOREIGN PATENT DOCUMENTS

| EP | 3188177 A1 | 7/2017 |
| KR | 10-2019-0048356 A | 5/2019 |
| KR | 10-2019-0048569 A | 5/2019 |

OTHER PUBLICATIONS

European Patent Office, Extended European Search Report and Opinion, EP Patent Application No. 20214549.6, dated May 10, 2021, 12 pages.

*Primary Examiner* — Sepehr Azari (74) *Attorney, Agent, or Firm* — Fenwick & West LLP (57) ABSTRACT

The present disclosure relates to a DRD type display panel. The display panel includes first to fourth pixels; a first data line through which a data signal is transmitted to the first and second pixels; a second data line through which a data signal is transmitted to the third and fourth pixels; a first gate line through which a scan signal is transmitted to the first and third pixels; a second gate line through which a scan signal is transmitted to the second and fourth pixels; a reference voltage line used to detect deterioration of OLEDs in the first to fourth pixels; a first power line positioned on the left of the first data line and supplying driving power to the first and second pixels; and a second power line positioned on the right of the second data line and supplying driving power to the first and second pixels.

4 Claims, 4 Drawing Sheets

(56) References Cited

U.S. PATENT DOCUMENTS

| | | | |
|---|---|---|---|
| 2014/0022289 A1* | 1/2014 | Lee | G09G 5/10 |
| | | | 345/691 |
| 2014/0252988 A1* | 9/2014 | Azizi | H05B 45/14 |
| | | | 315/307 |
| 2015/0130785 A1* | 5/2015 | Shin | G09G 5/18 |
| | | | 345/213 |
| 2017/0039952 A1* | 2/2017 | Kim | G09G 3/3233 |
| 2017/0132979 A1* | 5/2017 | Oh | G09G 3/3275 |
| 2017/0193923 A1 | 7/2017 | Park et al. | |
| 2017/0294166 A1* | 10/2017 | Kim | G09G 3/3266 |
| 2017/0345375 A1* | 11/2017 | Cho | G09G 5/18 |
| 2018/0012546 A1* | 1/2018 | Li | G09G 3/3233 |
| 2018/0122302 A1* | 5/2018 | Koong | G09G 3/3233 |
| 2018/0151126 A1* | 5/2018 | Jeong | G09G 3/3275 |
| 2018/0151129 A1* | 5/2018 | Park | G09G 3/3233 |
| 2018/0151658 A1* | 5/2018 | Jeong | H01L 27/3265 |
| 2018/0174517 A1* | 6/2018 | Lee | G09G 3/3233 |

* cited by examiner

DRD TYPE DISPLAY PANEL AND ORGANIC LIGHT EMITTING DISPLAY DEVICE USING SAME

CROSS-REFERENCE TO RELATED APPLICATION

This application claims priority from Republic of Korea Patent Application No. 10-2019-0174932 filed on Dec. 26, 2019 which is hereby incorporated by reference in its entirety.

FIELD OF TECHNOLOGY

The present disclosure relates to a double rate driving (DRD) type display panel and an organic light emitting display device, and more specifically, to an organic light emitting display device using DRD in which openings are disposed on the left and right of a driving circuit.

BACKGROUND

An organic light emitting display device has a structure in which an emission layer is formed between a cathode for electron injection and an anode for hole injection and uses the principle that, when electrons generated in the cathode and holes generated in the anode are injected into the emission layer, the injected electrons and holes are combined to generate excitons and transition of the generated excitons from an excited state to a ground state causes light emission.

Such an organic light emitting display device includes a transistor as a switching element. Transistors are classified into a bottom gate structure in which a gate electrode is positioned under an active layer and a top gate structure in which a gate electrode is positioned on an active layer.

Such an organic light emitting display device includes a scan driver for driving gate lines and a data driver for driving data lines, and the number of drive ICs required increases as the size and resolution of the organic light emitting display device increase.

However, since the drive IC is considerably expensive compared to other elements, various methods for reducing the number of drive ICs to decrease the manufacturing cost of the organic light emitting display device have recently been researched and developed. Among these methods, a double rate driving (DRD) method halves the number of data lines while doubling the number of gate lines, compared to conventional organic light emitting display devices, to realize resolution equivalent to those of the conventional organic light emitting display devices while halving the number of drive ICs required.

A data line through which an operating voltage is supplied to two subpixels is superposed on a reference voltage line through which a reference voltage is supplied to each pixel. This leads to a problem that a reference voltage signal is affected by a data signal due to DRD characteristics so that images are displayed dark due to ripple effect.

SUMMARY

An object of embodiments of the disclosure is to provide a display panel and an organic light emitting display device using the same which can increase an aperture ratio.

Another object of embodiments of the disclosure is to provide a display panel having a structure in which a reference voltage line is not superposed on a data line and an organic light emitting display device using the same.

To accomplish the objects, a display panel according to embodiments of the disclosure includes: first to fourth pixels provided on a substrate and including capacitor regions; a first data line DL1 through which a data signal is transmitted to the first and second pixels; a second data line DL2 through which a data signal is transmitted to the third and fourth pixels; a first gate line GL1 through which a scan signal is transmitted to the first and third pixels; a second gate line GL2 through which a scan signal is transmitted to the second and fourth pixels; a reference voltage line $V_{ref}$ disposed between the first data line and the second data line and used to detect deterioration of organic light-emitting diodes (OLEDs) disposed in the first to fourth pixels; a first power line VL1 positioned on the left of the first data line DL1 and supplying driving power to the first and second pixels; and a second power line VL2 positioned on the right of the second data line DL2 and supplying driving power to the third and fourth pixels.

In the display panel according to embodiments of the disclosure, the first to fourth pixels may constitute a unit pixel.

In the display panel according to embodiments of the disclosure, the first and second data lines may include a data line hole formed to supply a data voltage to each pixel and the first and second gate lines may be positioned between the data line hole and the capacitor regions.

The display panel according to embodiments of the disclosure may further include first to fourth drivers respectively provided in the first to fourth pixels, and the first to fourth drivers may be disposed between the first and second data lines DL1 and DL2 and the reference voltage line $V_{ref}$.

In the display panel according to embodiments of the disclosure, each of the first to fourth drivers may include: a driving transistor including a first source electrode connected to the first or second power line, a first drain electrode connected to an OLED, and a first gate electrode to which a signal from the first or second data line is applied and causing the OLED to emit light; a switching transistor including a second source electrode connected to the first or second data line, a second drain electrode connected to the first gate electrode, and a second gate electrode connected to the first or second gate line and controlling light emission of the OLED; a storage capacitor provided in a capacitor region between the first drain electrode and the second drain electrode and storing a signal from the first or second data line; and a sensing transistor including a third source electrode connected to the storage capacitor, a third drain electrode connected to the reference voltage line, and a third gate electrode connected to the first or second gate line and controlling a threshold voltage of the OLED to be detected according to a signal from the gate line.

An organic light emitting display device according to embodiments of the disclosure includes: the display panel as described above; a gate driver for sequentially supplying a scan pulse signal to gate lines of the display panel; a data driver for supplying data voltages to data lines of the display panel; and a timing controller for supplying control signals to the gate driver and the data driver in a double rate driving (DRD) manner.

The display panel and the organic light emitting display device using the same according to embodiments of the disclosure has a structure in which left and right openings are provided such that a reference voltage line is not superposed on a data line. Accordingly, an aperture ration can be maximized.

BRIEF DESCRIPTION OF THE DRAWINGS

The above and other objects, features, and advantages of the present disclosure will be more clearly understood from the following description taken in conjunction with the accompanying drawings, in which.

DETAILED DESCRIPTION

For embodiments of the present disclosure disclosed in the description, specific structural and functional descriptions are exemplified for the purpose of describing embodiments of the present disclosure, and embodiments of the present disclosure can be implemented in various forms and are not to be considered as a limitation of the disclosure.

Embodiments of the disclosure can be modified in various manners and have various forms and specific embodiments will be described in detail with reference to the drawings. However, the disclosure should not be construed as limited to the embodiments set forth herein, but on the contrary, the disclosure is to cover all modifications, equivalents, and alternatives falling within the spirit and scope of the embodiments.

While terms, such as "first", "second", etc., may be used to describe various components, such components must not be limited by the above terms. The above terms are used only to distinguish one component from another. For example, a first component may be referred to as a second component and the second component may be referred to as the first component without departing from the scope of embodiments of the disclosure.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements. Other representations for describing a relationship between elements, that is, "between", "immediately between", "in proximity to", "in direct proximity to" and the like should be interpreted in the same manner.

The terms used in the specification of the present disclosure are merely used in order to describe particular embodiments, and are not intended to limit the scope of the present disclosure. An element described in the singular form is intended to include a plurality of elements unless the context clearly indicates otherwise. In the specification of the present disclosure, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Unless otherwise defined, all terms including technical and scientific terms used herein have the same meaning as commonly understood by one of ordinary skill in the art to which example embodiments pertain. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Meanwhile, when a certain embodiment can be implemented in a different manner, a function or an operation specified in a specific block may be performed in a different sequence from that specified in a flowchart. For example, two consecutive blocks may be simultaneously executed or reversely executed according to related function or operation.

In the following description, a pixel circuit and a gate driving circuit formed on a substrate of a display panel may be implemented by n-type or p-type transistors. For example, a transistor may be implemented by a MOSFET (metal oxide semiconductor field effect transistor). The transistor is a three-electrode element including a gate electrode, a source electrode, and a drain electrode. The source electrode is an electrode that provides carriers to the transistor. Carriers flow from the source in the transistor. The drain electrode is an electrode through which carriers are emitted in the transistor. For example, carriers flow from the source electrode to the drain electrode in the transistor. In the case of the n-type transistor, carriers are electrons and thus a source voltage is lower than a drain voltage such that the electrons can flow from the source to the drain. Since electrons flow from the source electrode to the drain electrode in the n-type transistor, current flows from the drain electrode to the source electrode. In the case of the p-type transistor, carriers are holes and thus a source voltage is higher than a drain voltage such that the holes can flow from the source electrode to the drain electrode. Since holes flow from the source electrode to the drain electrode in the p-type transistor, current flows from the source electrode to the drain electrode. The source electrode and the drain electrode of a transistor are not fixed and may be interchanged according to voltages applied thereto.

A gate on voltage may be a voltage of a gate signal at which a transistor can be turned on. A gate off voltage may be a voltage at which a transistor can be turned off. A gate on voltage of the p-type transistor may be a logic low voltage VL and a gate off voltage thereof may be a logic high voltage VH. A gate on voltage of the n-type transistor may be a logic high voltage and a gate off voltage thereof may be a logic low voltage.

Hereinafter, configurations and operation of a display panel and an organic light emitting display device using the same according to embodiments of the present disclosure will be described with reference to the attached drawings.

Figure 1:
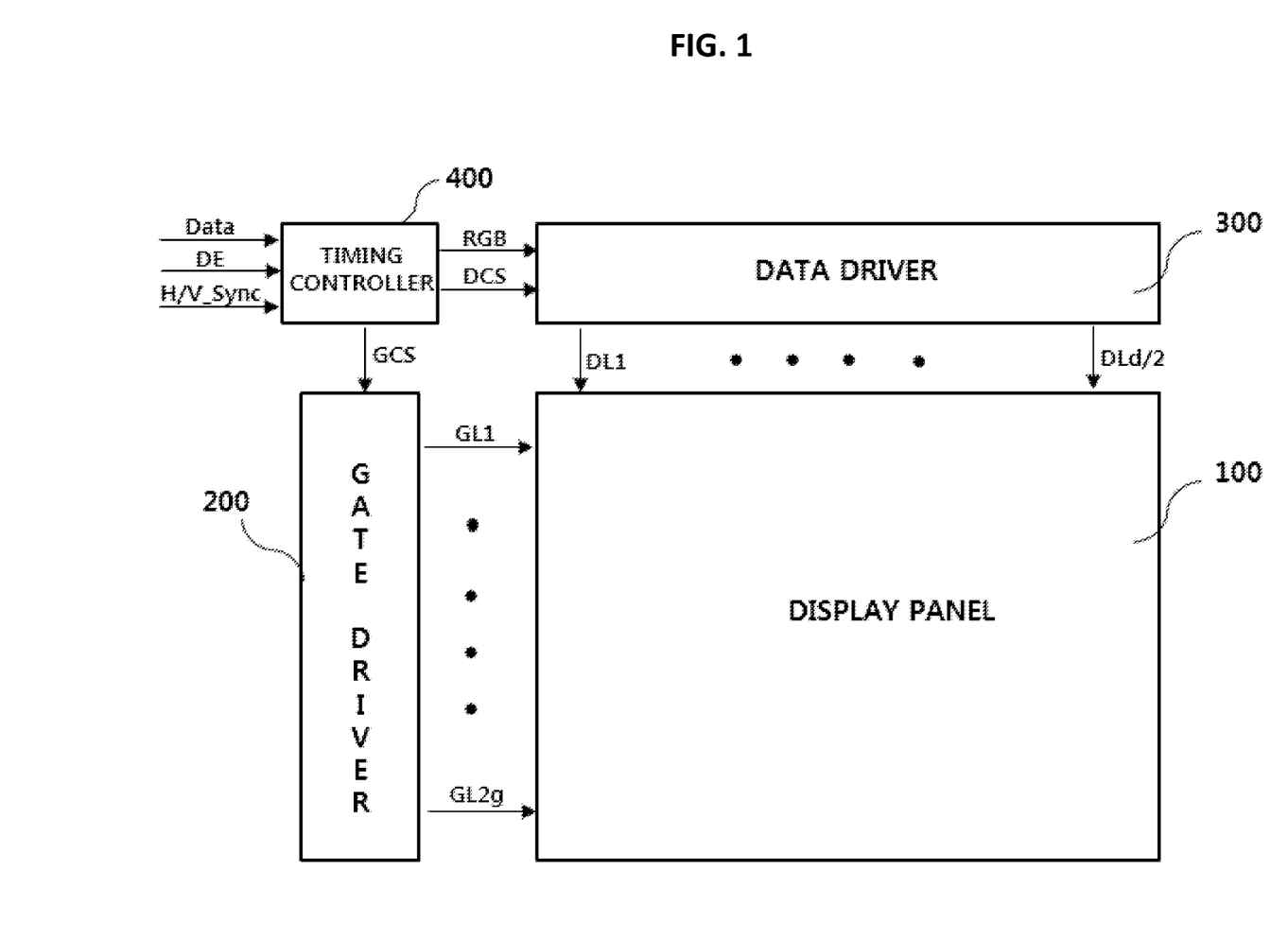
FIG. 1 is a block diagram schematically showing a configuration of an organic light emitting display device according to embodiments of the disclosure.

FIG. 1 is a block diagram schematically showing a configuration of an organic light emitting display device according to embodiments of the present disclosure. In the organic light emitting display device according to embodiments of the present disclosure, a display panel 100 uses double rate driving (hereinafter simply referred to as "DRD"). That is, as shown in FIG. 1, d/2 data lines DL1 to DLd/2 and 2g gate lines GL1 to GL2g are arranged in a matrix in an intersecting manner such that d×g pixels are formed in a DRD type.

The organic light emitting display device includes the display panel 100 in which a pixel electrode is formed at each pixel, a gate driver 200 which sequentially supplies a scan pulse signal to the gate lines GL1 to GL2g, a data driver 300 which supplies data voltages to the data lines DL1 to DLd/2, and a timing controller 400 which controls driving timings of the gate driver 200 and the data driver 300 through DRD.

DRD is a method for reducing the number of data drivers 300 or the number of data lines DL of the display device. In the display panel 100 using DRD, the number of gate lines GL is doubled whereas the number of data lines DL is halved, compared to conventional display devices. That is, DRD can realize the same resolution as conventional display devices while halving the required number of drivers 300 or the required number of data lines DL.

That is, in the display device using DRD according to embodiments of the present disclosure, d pixels arranged in a single horizontal line of the display panel 100 can be driven using two gate lines GL and d/2 data lines DL arranged above and below the horizontal line.

The timing controller 400 outputs a gate control signal GCS for controlling the gate driver 200 and a data control signal DCS for controlling the data driver 300 using vertical/horizontal synchronization signals and a clock signal supplied from an external system (not shown).

Further, the timing controller 400 samples input image data input from the external system, rearranges the sampled input image data and provides the rearranged digital image data RGB to the data driver 300.

The timing controller 400 generates the gate control signal GCS for controlling the gate driver 200 and the data control signal DCS for controlling the data driver 300 using a clock signal, a horizontal synchronization signal H_Sync, a vertical synchronization signal V_Sync, and a data enable signal DE supplied from the external system and transmits the gate control signal GCS and the data control signal DCS to the gate driver 200 and the data driver 300.

The timing controller 400 may include a receiver for receiving input image data and various signals from the external system, an image data processor for rearranging input image data from among signals received through the receiver such that the input image data is suited to the display panel to generate rearranged digital image data, a control signal generator for generating the gate control signal GCS and the data control signal DCS for controlling the gate driver 200 and the data driver 300 using signals received through the receiver, and a transmitter for outputting image data generated by the image data processor and control signals to the data driver 300 and the gate driver 200.

The data driver 300 converts image data input from the timing controller 400 into an analog data voltage and supplies a data voltage corresponding to one horizontal line to the data lines for each horizontal period in which a gate pulse signal is supplied to the gate lines. That is, the data driver 300 converts image data into a data voltage using gamma voltages supplied from a gamma voltage generator (not shown) and then outputs the data voltage to the data lines.

The data driver 300 shifts a source start pulse signal SSP from the timing controller 400 according to a source shift clock signal SSC to generate a sampling signal. In addition, the data driver 300 latches pixel data RGB (image data) input according to the source shift clock signal SSC using the sampling signal, converts the pixel data RGB into a data voltage, and then supplies the data voltage to the data lines in units of a horizontal line in response to a source output enable signal SOE. To this end, the data driver 300 may include a shift register, a latch, a digital-to-analog converter, and an output buffer.

The gate driver 200 sequentially supplies a scan pulse signal to the gate lines GL1 to GL2g of the display panel 100 in response to the gate control signal GCS input from the timing controller 400. Accordingly, switching transistors formed in respective pixels of a corresponding horizontal line to which the scan pulse signal is applied are turned on so that an image can be output to the pixels.

That is, the gate driver 200 shifts a gate start pulse signal GSP supplied from the timing controller 400 according to a gate shift clock signal GSC and sequentially supplies a scan pulse signal having a gate on voltage Von to gate lines GL1 to GL2g. Further, the gate driver 200 supplies a gate off voltage Voff to the gate lines GL1 to GL2g in a period in which the scan pulse signal at the gate on voltage Von is not supplied.

Although the gate driver 200 may be formed independently of the display panel 100 and electrically connected to the display panel in various manners, the gate driver 200 may be configured in the form of a gate in panel (GIP) mounted in the display panel 100. In this case, gate control signals for controlling the gate driver 200 may include a start signal VST and a gate clock signal GCLK.

Although the data driver 300, the gate driver 200 and the timing controller 400 are independently configured in the above description, at least one of the data driver 300 and the gate driver 200 may be integrated with the timing controller 400.

A specific structure of a pixel formed in the display panel 100 using DRD will be described in detail below with reference to FIGS. 2 and 3.

Figure 2:
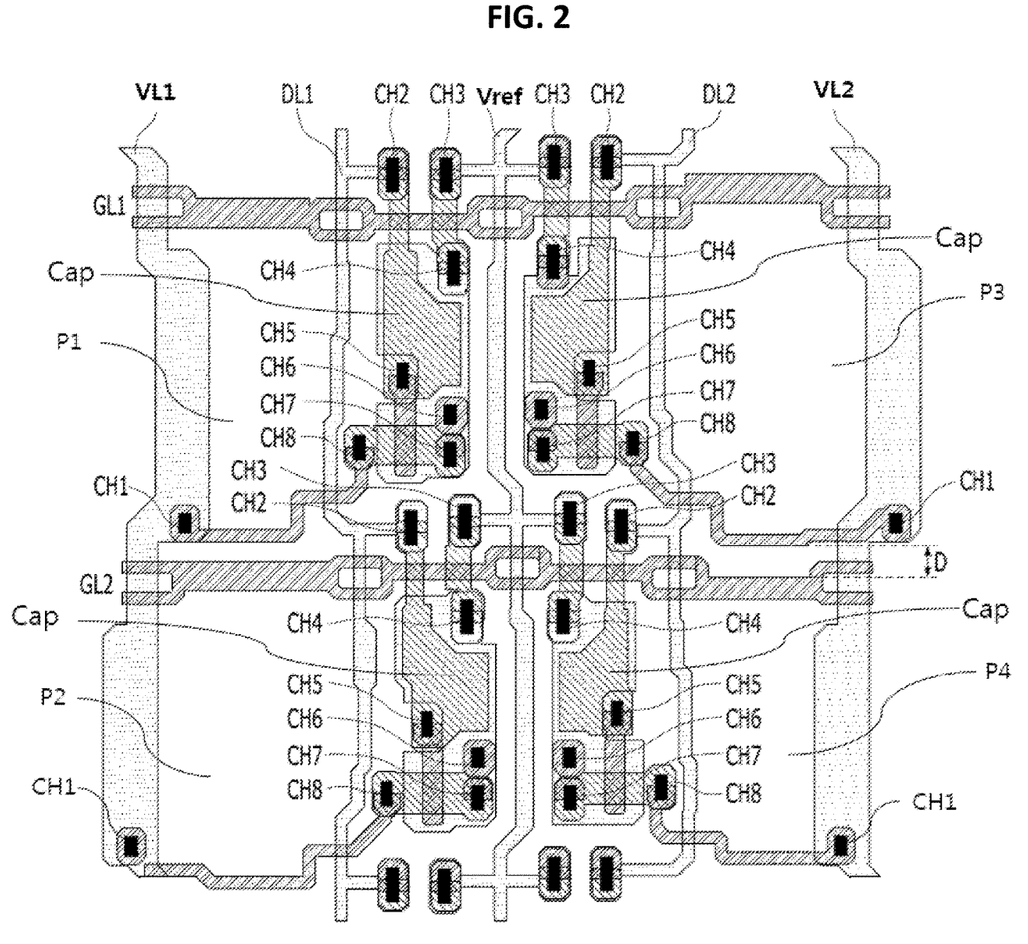
FIG. 2 illustrates a configuration of a display panel according to embodiments of the disclosure.
Figure 3:
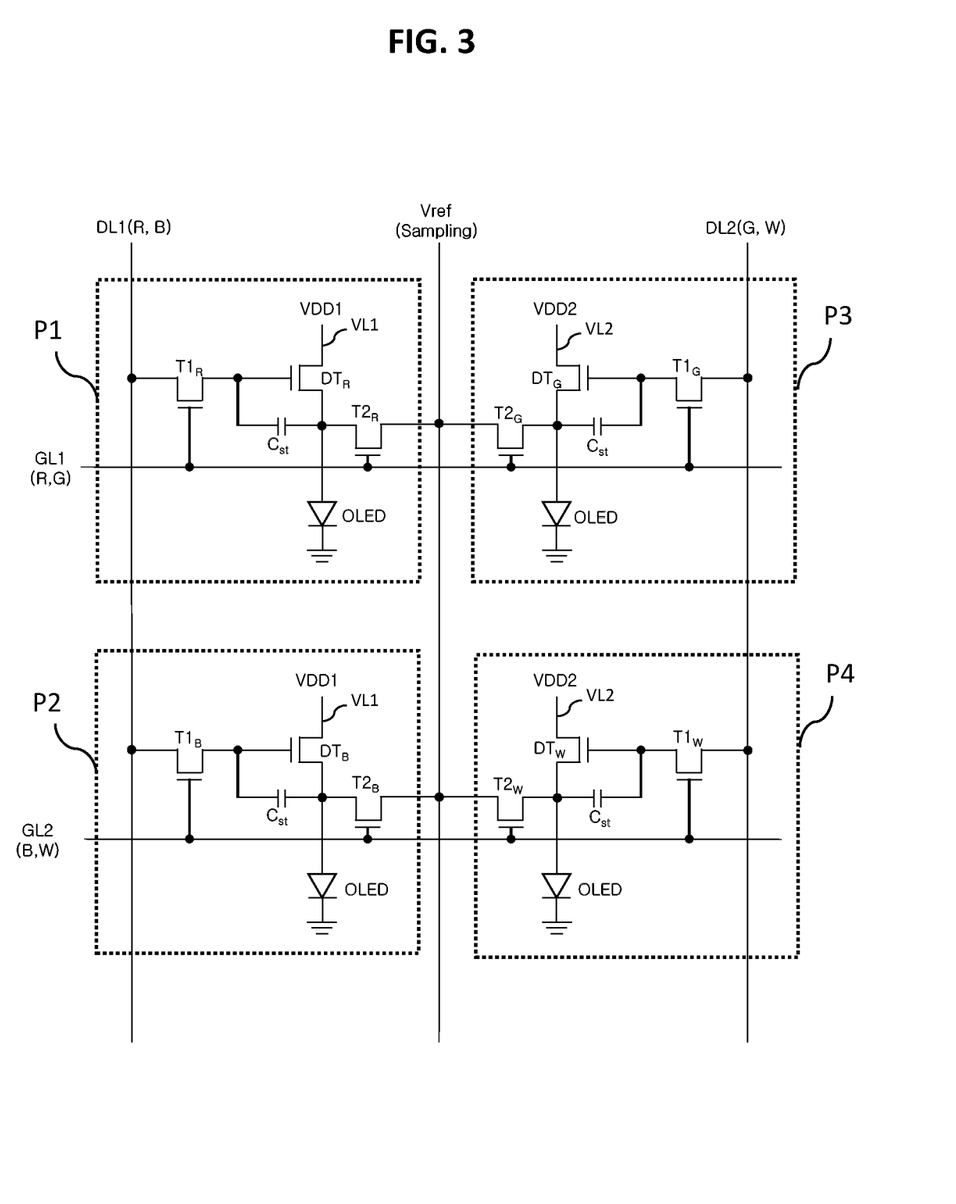
FIG. 3 illustrates an equivalent circuit of the display panel of FIG. 2 according to embodiments of the disclosure.

FIG. 2 illustrates a configuration of a pixel of the display device according to embodiments of the present disclosure and FIG. 3 illustrates an equivalent circuit of the display panel of FIG. 2. Although a pixel is composed of an n-type transistor in the present embodiment, the pixel may be composed of a p-type transistor or composed of both the n-type transistor and the p-type transistor.

As shown in FIG. 2, a pixel has a QUAD structure including four subpixels P1 to P4 in the display device according to an embodiment of the present disclosure. Here, the first to fourth subpixels can be configured using organic light-emitting diodes (OLEDs) capable of representing red R, green G, blue B, and white W. This is merely an embodiment for describing the present disclosure and the subpixels may be configured using OLEDs capable of representing R, G and B.

As shown in FIG. 2, a unit pixel includes first and second gate lines GL1 and GL2 arranged in a first direction, first and second power lines VL1 and VL2 which intersect the first and second gate lines GL1 and GL2 and are arranged in a second direction, first and second data lines DL1 and DL2, a reference voltage line $V_{ref}$ and first to fourth pixel drivers. The first to fourth pixel drivers are arranged such that pairs of the pixel drivers are symmetrically disposed on the basis of the reference voltage line $V_{ref}$.

The first and second subpixels P1 and P2 are formed between the first power line VL1 and the reference voltage line $V_{ref}$ and the third and fourth subpixels P3 and P4 are formed between the reference voltage line $V_{ref}$ and the second power line VL2.

The first to fourth pixel drivers composed of a plurality of transistors and capacitors are arranged such that they are symmetrical on the basis of the reference voltage line $V_{ref}$. The first to fourth drivers are arranged between the data lines DL1 and DL2 and the reference voltage line $V_{ref}$.

The first pixel driver for driving the first subpixel P1 and the second pixel driver for driving the second subpixel P2 are arranged between the first data line DL1 and the reference voltage line $V_{ref}$. The third pixel driver for driving the third subpixel P3 and the fourth pixel driver for driving the fourth subpixel P4 are arranged between the reference voltage line $V_{ref}$ and the second data line DL2.

A data voltage is supplied to the first pixel driver for driving the first subpixel P1 and the second pixel driver for driving the second subpixel P2 through the first data line DL1. A data voltage is supplied to the third pixel driver for driving the third subpixel P3 and the fourth pixel driver for driving the fourth subpixel P4 through the second data line DL2.

A scan pulse signal is supplied to a scan transistor formed in the first pixel driver of the first subpixel P1 and a scan transistor formed in the second pixel driver of the second subpixel P2 through the first gate line GL1. A scan pulse signal is supplied to a scan transistor formed in the third pixel driver of the third subpixel P3 and a scan transistor formed in the fourth pixel driver of the fourth subpixel P4 through the second gate line GL2.

The subpixels P1 to P4 of each unit pixel include the first to fourth pixel drivers each including a plurality of transistors T1, T2 and DT, a capacitor $C_{st}$, and an OLED, as shown in FIG. 3.

Each pixel driver includes a driving transistor DT which causes an OLED to emit light, a switching transistor T1 which controls light emission of the OLED according to a signal from a gate line, and a sensing transistor T2 which performs control such that a threshold voltage of the driving transistor DT is sensed according to a signal from the gate line.

A first driving transistor $DT_R$ of the first pixel driver includes a first source electrode connected to the first power line VL1, a first drain electrode connected to the OLED, and a first gate electrode to which a driving signal from the first data line DL1 is applied and supplies a driving current necessary to operate the OLED of the first pixel driver. The first source electrode of the first driving transistor $DT_R$ is connected to the first power line VL1 through a contact hole CH1 and a contact hole CH8. A semiconductor compound layer between the first source electrode and the first drain electrode of the first driving transistor $DT_R$ is connected through a contact hole CH7 and the contact hole CH8.

A first switching transistor $T1_R$ of the first pixel driver includes a second source electrode connected to the first data line DL1, a second drain electrode connected to the first gate electrode of the first driving transistor $DT_R$, and a second gate electrode connected to the first gate line GL1 and transfers a data voltage to the first gate electrode of the first driving transistor $DT_R$.

The second source electrode of the first switching transistor $T1_R$ is connected to the first data line DL1 through a contact hole CH2. The second drain electrode of the first switching transistor $T1_R$ is connected to the first gate electrode of the first driving transistor $DT_R$ through a contact hole CH6. The second gate electrode of the first switching transistor $T1_R$ is connected to the first gate line GL1.

The storage capacitor $C_{st}$ of the first pixel driver is provided in a capacitor region between the first drain electrode of the first driving transistor $DT_R$ and the second drain electrode of the first switching transistor $T1_R$ and stores a data voltage supplied through the first data line DL1. One terminal of the storage capacitor $C_{st}$ of the first pixel driver is connected to the first drain electrode of the first driving transistor $DT_R$ through the contact hole CH6 and the other terminal thereof is connected to the second drain electrode of the first switching transistor $T1_R$ and the first gate electrode of the first driving transistor $DT_R$.

A first sensing transistor $T2_R$ of the first pixel driver includes a third source electrode connected to the storage capacitor $C_{st}$, a third drain electrode connected to the reference voltage line $V_{ref}$, and a third gate electrode connected to the first gate line GL1 and senses a threshold voltage of the first driving transistor $DT_R$ according to a signal provided through the first gate line GL1. The third source electrode of the first sensing transistor $T2_R$ is connected to the reference voltage line $V_{ref}$ through a contact hole CH3. A semiconductor compound layer between the third source electrode and the third drain electrode of the first sensing transistor $T2_R$ is connected through the contact hole CH3 and a contact hole CH4. The third drain electrode of the first sensing transistor $T2_R$ is connected to the capacitor $C_{st}$ through the contact hole CH4 and a contact hole CH5 and connected to the first drain electrode of the first driving transistor $DT_R$ through the contact hole CH4 and the contact hole CH7.

A second driving transistor $DT_B$ of the second pixel driver has a configuration similar to that of the first driving transistor $DT_R$ of the first pixel driver and supplies a driving current necessary to operate the OLED of the second pixel driver.

The first source electrode of the second driving transistor $DT_B$ is connected to the first power line VL1 through the contact hole CH1 and the contact hole CH8. A semiconductor compound layer between the first source electrode and the first drain electrode of the second driving transistor $DT_B$ is connected through the contact hole CH7 and the contact hole CH8.

A second switching transistor $T1_B$ of the second pixel driver includes a second source electrode connected to the first data line DL1, a second drain electrode connected to the first gate electrode of the second driving transistor $DT_B$, and a second gate electrode connected to the second gate line GL2 and transfers a data voltage supplied through the first data line DL1 to the first gate electrode of the second driving transistor $DT_B$. The second source electrode of the second switching transistor $T1_B$ is connected to the first data line DL1 through the contact hole CH2. The second drain electrode of the second switching transistor $T1_B$ is connected to the first gate electrode of the second driving transistor $DT_B$ through the contact hole CH6. The second gate electrode of the second switching transistor $T1_B$ is connected to the first gate line GL1.

A second sensing transistor $T2_B$ of the second pixel driver includes a third source electrode connected to the storage capacitor $C_{st}$ of the second pixel driver, a third drain electrode connected to the reference voltage line $V_{ref}$, and a third gate electrode connected to the second gate line GL2 and senses a threshold voltage of the second driving transistor $DT_B$ according to a signal provided through the second gate line GL2. A semiconductor compound layer between the third source electrode and the third drain electrode of the second sensing transistor $T2_B$ is connected through the contact hole CH3 and the contact hole CH4. The third drain electrode of the second sensing transistor $T2_B$ is connected to the capacitor $C_{st}$ through the contact hole CH4 and the contact hole CH5 and connected to the first drain electrode of the second driving transistor $DT_B$ through the contact hole CH4 and the contact hole CH6.

A third driving transistor $DT_G$ of the third pixel driver includes a first source electrode connected to the second power line VL2, a first drain electrode connected to the OLED, and a first gate electrode to which a driving signal from the second data line DL2 is applied and supplies a driving current necessary to operate the OLED of the third pixel driver. The first source electrode of the third driving transistor $DT_G$ is connected to the second power line VL2 through the contact hole CH1 and the contact hole CH8. A semiconductor compound layer between the first source electrode and the first drain electrode of the third driving transistor $DT_G$ is connected through the contact hole CH7 and the contact hole CH8.

A third switching transistor $T1_G$ of the third pixel driver includes a second source electrode connected to the second data line DL2, a second drain electrode connected to the first gate electrode of the third driving transistor $DT_G$, and a second gate electrode connected to the first gate line GL1 and transfers a data voltage supplied through the first data line DL1 to the first gate electrode of the third driving transistor $DT_G$. The second source electrode of the third switching transistor $T1_G$ is connected to the second data line DL2 through the contact hole CH2. The second drain electrode of the third switching transistor $T1_G$ is connected to the first gate electrode of the third driving transistor $DT_G$ through the contact hole CH6. The second gate electrode of the third switching transistor $T1_G$ is connected to the second gate line GL2.

A third sensing transistor $T2_G$ of the third pixel driver includes a third source electrode connected to the storage capacitor $C_{st}$ of the third pixel driver, a third drain electrode connected to the reference voltage line $V_{ref}$, and a third gate electrode connected to the first gate line GL1 and senses a threshold voltage of the third driving transistor $DT_G$ according to a signal provided through the first gate line GL1. A semiconductor compound layer between the third source electrode and the third drain electrode of the third sensing transistor $T2_G$ is connected through the contact hole CH3 and a contact hole CH4. The third drain electrode of the third sensing transistor $T2_G$ is connected to the capacitor $C_{st}$ through the contact hole CH4 and the contact hole CH5 and is connected to the first drain electrode of the third driving transistor $DT_G$ through the contact hole CH4 and the contact hole CH7.

A fourth driving transistor $DT_W$ of the fourth pixel driver includes a first source electrode connected to the second power line VL2, a first drain electrode connected to the OLED, and a first gate electrode to which a driving signal from the second data line DL2 is applied and supplies a driving current necessary to operate the OLED of the fourth pixel driver. The first source electrode of the fourth driving transistor $DT_W$ is connected to the second power line VL2 through the contact hole CH1 and the contact hole CH8. A semiconductor compound layer between the first source electrode and the first drain electrode of the fourth driving transistor $DT_W$ is connected through the contact hole CH7 and the contact hole CH8.

A fourth switching transistor $T1_W$ of the fourth pixel driver includes a second source electrode connected to the second data line DL2, a second drain electrode connected to the first gate electrode of the fourth driving transistor $DT_W$, and a second gate electrode connected to the second gate line GL2 and transfers a data voltage supplied through the second data line DL2 to the first gate electrode of the fourth driving transistor $DT_W$. The second source electrode of the fourth switching transistor $T1_W$ is connected to the second data line DL2 through the contact hole CH2. The second drain electrode of the fourth switching transistor $T1_W$ is connected to the first gate electrode of the fourth driving transistor $DT_W$ through the contact hole CH6. The second gate electrode of the fourth switching transistor $T1_W$ is connected to the second gate line GL2.

A fourth sensing transistor $T2_W$ of the fourth pixel driver includes a third source electrode connected to the storage capacitor $C_{st}$ of the fourth pixel driver, a third drain electrode connected to the reference voltage line $V_{ref}$, and a third gate electrode connected to the second gate line GL2 and senses a threshold voltage of the fourth driving transistor $DT_W$ according to a signal provided through the second gate line GL2. A semiconductor compound layer between the third source electrode and the third drain electrode of the fourth sensing transistor $T2_W$ is connected through the contact hole CH3 and a contact hole CH4. The third drain electrode of the fourth sensing transistor $T2_W$ is connected to the capacitor $C_{st}$ through the contact hole CH4 and the contact hole CH5 and is connected to the first drain electrode of the fourth driving transistor $DT_W$ through the contact hole CH4 and the contact hole CH7.

The first and second data lines DL1 and DL2 include a data line hole CH2 formed to supply a data voltage to each pixel and the first and second gate lines GL1 and GL2 are positioned between the data line hole CH2 and a capacitor region.

Figure 4:
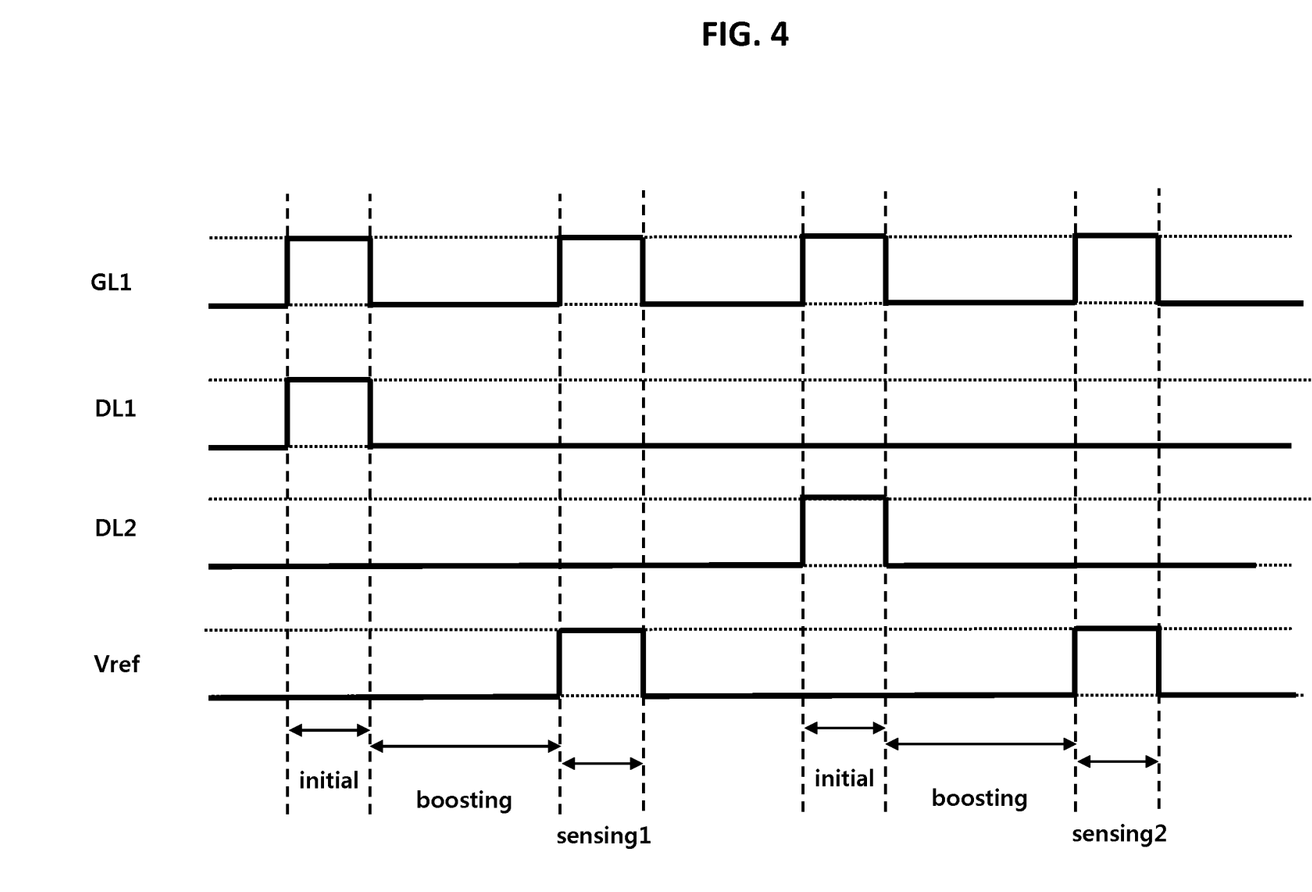
FIG. 4 shows voltages and signals supplied to elements of each pixel driver according to embodiments of the disclosure.

The first to fourth pixel drivers included in the display panel according to embodiments of the present disclosure have a 1SCAN structure, that is, a configuration in which a switching transistor and a sensing transistor simultaneously operate. Here, voltages and signals supplied to elements of each pixel driver are as shown in FIG. 4. For example, a sampling signal is not supplied for a period in which a data voltage is supplied through a data line among periods in which a first scan pulse signal is provided. Accordingly, a scan transistor is turned on but a sampling transistor is turned off. A data voltage supplied through a data line is blocked and the sampling signal is supplied in another period among the periods in which the first scan signal is provided. Accordingly, the scan transistor is turned off but the sampling transistor is turned on.

Accordingly, the first gate line GL1 carries the same scan pulse signal to the gate electrodes of the first and third switching transistors $T1_R$ and $T1_G$ and the gate electrodes of the first and third sensing transistors $T2_R$ and $T2_G$ of the first and third pixel drivers P1 and P3 and carries the same scan pulse signal to the gate electrodes of the second and fourth switching transistors $T1_B$ and $T1_W$ and the gate electrodes of the second and fourth sensing transistors $T2_B$ and $T2_W$ of the second and fourth pixel drivers P2 and P4.

A data voltage is supplied through the first data line DL1 to the source electrodes of the first and second switching transistors $T1_R$ and $T1_B$ of the first and second pixel drivers P1 and P2, and a data voltage is supplied through the second data line DL2 to the source electrodes of the third and fourth switching transistors $T1_G$ and $T1_W$ of the third and fourth pixel drivers P3 and P4.

The source electrodes of the first to fourth sensing transistors $T2_R$, $T2_B$, $T2_G$ and $T2_W$ receive a sampling signal through the reference voltage line $V_{ref}$.

It will be apparent to those skilled in the art that various modifications and variations can be made in embodiments of the present disclosure without departing from the spirit or scope of the disclosure. Thus, it is intended that the present disclosure cover the modifications and variations of this disclosure provided they come within the scope of the appended claims and their equivalents.

What is claimed is:

1. A display panel operating in a double rate driving manner, comprising:

first to fourth pixels provided on a substrate in a plan view of a physical layout of the display device, the first to fourth pixels including capacitor regions;
a first data line in the plan view of the physical layout of the display device, the first data line through which a data signal is transmitted to the first pixel and the second pixel;
a second data line in the plan view of the physical layout of the display device, the second data line through which a data signal is transmitted to the third pixel and the fourth pixel;
a first gate line in the plan view of the physical layout of the display device, the first gate line through which a scan signal is transmitted to the first pixel and the third pixel;
a second gate line in the plan view of the physical layout of the display device, the second gate line through which a scan signal is transmitted to the second pixel and the fourth pixel;
a reference voltage line disposed between the first data line and the second data line in the plan view of the physical layout of the display device, the reference voltage line used to detect deterioration of organic light-emitting diodes (OLEDs) disposed in the first to fourth pixels;
a first power line positioned on a left of the first data line in the plan view of the physical layout of the display device, the first power line supplying driving power to the first pixel and the second pixel; and
a second power line positioned on a right of the second data line in the plan view of the physical layout of the display device, the second power line supplying driving power to the third pixel and the fourth pixel,
wherein the first data line and the second data line are disposed between the first power line and the second power line without a third data line being disposed between the first power line and the second power line in the plan view of the physical layout of the display device,
wherein at least the first pixel includes a first driver that is between the first data line and the reference voltage line in the plan view of the physical layout of the display device, the first driver including:
  a driving transistor including a first source electrode connected to the first power line, a first drain electrode connected to a first OLED, and a first gate electrode to which a signal from the first data line is applied and causing the first OLED to emit light;
  a switching transistor including a second source electrode connected to the first data line, a second drain electrode connected to the first gate electrode of the driving transistor, and a second gate electrode connected to the first gate line and controlling light emission of the first OLED;
  a storage capacitor provided in a capacitor region between the first drain electrode of the driving transistor and the second drain electrode of the switching transistor, the storage capacitor storing the signal from the first data line; and
  a sensing transistor including a third source electrode connected to the storage capacitor, a third drain electrode connected to the reference voltage line, and a third gate electrode connected to the first gate line that is also connected to the second gate electrode of the switching transistor, the sensing transistor controlling a threshold voltage of the first OLED to be detected according to a signal from the first or second gate line,
wherein the third pixel includes a third driver that is between the second data line and the reference voltage line in the plan view of the physical layout of the display device, the third driver including:
  a driving transistor including a first source electrode connected to the second power line, a first drain electrode connected to third OLED, and a first gate electrode to which a signal from the second data line is applied and causing the third OLED to emit light;
  a switching transistor including a second source electrode connected to the second data line, a second drain electrode connected to the first gate electrode of the driving transistor of the third driver, and a second gate electrode connected to the first gate line that is also connected to the second gate electrode of the switching transistor included in the first driver and the third gate electrode of the sensing transistor included in the first driver and controlling light emission of the third OLED;
  a storage capacitor provided in a capacitor region between the first drain electrode of the third driver and the second drain electrode of the third driver and storing the signal from the second data line; and
  a sensing transistor including a third source electrode connected to the storage capacitor of the third driver, a third drain electrode connected to the reference voltage line that is also connected to the third drain electrode of the sensing transistor included in the first driver, and a third gate electrode connected to the first gate line that is also connected to the second gate electrode of the third driver, the second gate electrode of the switching transistor included in the first driver, and the third gate electrode of the sensing transistor included in the first driver and controlling a threshold voltage of the third OLED to be detected according to a signal from the first,
wherein the reference voltage line is disposed between the first pixel and the third pixel in the plan view of the physical layout of the display device,
wherein the first data line includes a first data line hole in the plan view of the physical design of the display device to supply a first data voltage to the first pixel, and the second data line include a second data line hole in the plan view of the physical layout of the display device to supply a second data voltage to the third pixel and the first and second gate lines are positioned between the data line hole and the capacitor regions in the plan view of the physical layout of the display device, and the reference voltage line is disposed between the first data line hole and the second data line hole in the plan view of the physical layout of the display device.

2. The display panel of claim 1, wherein the first to fourth pixels constitute a unit pixel.

3. The display panel of claim 1, further comprising a second driver included in the second pixel and a fourth driver included in the fourth pixel in the plan view of the physical layout of the display device,
wherein the first driver to fourth driver are disposed between the first data line and the second data line and the reference voltage line in the plan view of the physical layout of the display device.

4. An organic light emitting display device operating in a double rate driving manner, comprising:

the display panel according to claim 1;
a gate driver for sequentially supplying a scan pulse signal to the first gate line and the second gate line of the display panel;
a data driver for supplying data voltages to the first data line and the second data line of the display panel; and
a timing controller for supplying control signals to the gate driver and the data driver in a double rate driving manner.

* * * * *